(12) United States Patent
Ash

(10) Patent No.: US 6,714,333 B2
(45) Date of Patent: Mar. 30, 2004

(54) MODULATOR ASSEMBLY

(75) Inventor: Richard Mark Ash, Bury St Edmunds (GB)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 10/146,048

(22) Filed: May 16, 2002

(65) Prior Publication Data

US 2003/0020997 A1 Jan. 30, 2003

(30) Foreign Application Priority Data

Jul. 30, 2001 (EP) .......................................... 01306522

(51) Int. Cl.$^7$ ................................................ G02F 1/01
(52) U.S. Cl. ........................... 359/238; 359/237; 385/2
(58) Field of Search ................................ 359/238, 237; 398/79, 83, 158; 385/1, 2

(56) References Cited

U.S. PATENT DOCUMENTS

| | | |
|---|---|---|
| 5,080,504 A | 1/1992 | Partain et al. |
| 5,202,897 A | 4/1993 | Whitehead |
| 5,999,284 A * | 12/1999 | Roberts ...................... 359/108 |

FOREIGN PATENT DOCUMENTS

| | | |
|---|---|---|
| EP | 1093244 A | 4/2001 |
| WO | 99 42879 | 8/1999 |

OTHER PUBLICATIONS

"Temperature–Dependent Characteristics of Gaas/Algaas Multiple–Quantum–Well Optical Modulators" Journal of applied Physics, American Institute fo Physics. New York, US, vol. 66, No. 8 Oct. 15, 1989, pp. 3445–3452, XP000073901, ISSN: 0021–8979.

* cited by examiner

Primary Examiner—Scott J. Sugarman
Assistant Examiner—Richard Hanig

(57) ABSTRACT

A modulator assembly for modulation of light, for use as part of an opto-electronic communication network, has a light modulator assembly comprising a modulator element comprising a modulating medium for modulating the intensity of light passing therethrough. A single electrode applies an electric field across the modulating medium and heats the medium. The medium has an absorption edge at a wavelength dependent on the temperature of the medium and the applied electric field. The electrode heats the modulating medium such that the wavelength of the absorption edge aligns with the wavelength of the light to be modulated.

18 Claims, 7 Drawing Sheets

MODULATOR ASSEMBLY

CROSS REFERENCE TO RELATED APPLICATIONS n/a

STATEMENT REGARDING FEDERALLY SPONSORED RESEARCH OR DEVELOPMENT n/a

SEQUENCE LISTING n/a

BACKGROUND OF INVENTION

FIELD OF INVENTION

The present invention relates to a modulator assembly for modulation of light, in particular for use as part of an opto-electronic communication network.

BACKGROUND ART

In an opto-electronic communication network, it is desirable to produce high frequency modulated light. One way of achieving this is to pass light of initially constant intensity through a modulator. Normally the modulator is formed using a modulator medium whose optical properties depend on an electric field applied across it, so that modulating the electric field across the modulator medium results in a modulation in the intensity of light passing through it. Examples of modulators used to modulate light from a laser include electro-absorption modulators, Mach-Zender interferometer modulators, and Fabry-Perot modulators.

The modulator is normally biased with a quiescent voltage in order to bring it into an operating mode where an absorption edge of the modulator medium is close to the wavelength of the light being modulated. A modulation voltage is superimposed onto the quiescent voltage in order to modulate the intensity of light passing through the modulator medium. The quiescent voltage normally being constant in time or slowly varying compared to the modulation voltage since it need only change with changing material properties of the modulator medium e.g. with temperature.

One of the disadvantages of such a system is that the absorption/transmission spectra of materials usually suitable for modulator media change with temperature, owing to changes in the semiconductor bandgap of the modulator material, changes in the cavity refractive index or changes in the geometrical thickness of the device. For example, the absorption edge of an electro-absorption modulator is known to change by around 0.4 nm/K whereas the operating wavelength of a typical single mode distributed feedback lasers changes only at around 0.07 nm/K.

Conventionally, for successful operation such devices are cooled to maintain alignment of the modulator absorption edge to that of the lasing wavelength. This is often accomplished using a thermoelectric cooler (TEC) to dissipate the heat generated by the laser diode. Such heat dissipation consumes large amounts of power and requires a large heatsinking capability.

Recently laser diodes have been fabricated which do not themselves require cooling for successful operation, so it is highly desirable to develop a modulator assembly which allows a laser and modulator combination to operate without the need for a TEC.

SUMMARY OF THE INVENTION

According to one aspect of the present invention there is provided a light modulator assembly comprising a modulator element comprising a modulating medium, for modulating the intensity of light passing therethrough; and means for applying an electric field across the modulating medium, the modulating medium having an absorption edge at a wavelength dependent upon the temperature of the medium and upon the applied electric field; and means for heating the modulating medium such that the wavelength of the absorption edge aligns with the wavelength of the light to be modulated. The means for applying an electric field comprises an electrode, which also constitutes the means for heating the modulating medium.

Preferably the means for heating the modulating medium comprises a metallic element in close proximity to the modulating element.

The device may also comprise a thermally insulating layer of low thermal conductivity and my also have slots each side of the modulating medium.

Another aspect of the invention relates to a light assembly comprising a modulator element comprising a modulating medium, for modulating the intensity of light passing therethrough; and means for applying an electric filed across the modulating medium, the modulating medium having an absorption range at a wavelength dependent on the temperature of the medium and upon the applied electric field; and means for heating the modulating medium such that the wavelength of the absorption edge aligns with the wavelength of the light to be modulated, and wherein the extinction ratio of an induced photocurrent in the modulating element is used in a feedback loop to set the drive current of the heating element.

Another aspect of the invention relates to a light modulator assembly comprising a modulator element comprising a modulating medium for modulating the intensity of a light passing therethrough the modulating medium having an absorption edge at a wavelength dependent upon temperature of the medium and upon electric field applied to the medium, and an electrode positioned applied arranged for applying an electric field to the medium and for heating the medium such that the wavelength of the absorption edge aligns with the wavelength of the light to be modulated.

An added aspect of the invention relates to a light modulator assembly comprising a modulator element comprising a modulating medium, for modulating the intensity of light passing therethrough; and an electric field applicator for applying an electric field across the modulating medium, the modulating medium having an absorption edge at a wavelength dependent upon the temperature of the medium and upon the applied electric field; and a heater for heating the modulating a feedback loop coupled to be responsive to the extinction ratio of an induced photocurrent in the modulating element for controlling drive current of the heating element.

BRIEF DESCRIPTION OF THE DRAWING

Embodiments of the invention will now be described, by way of example only, with reference to the accompanying drawings in which.

DETAILED DESCRIPTION OF THE INVENTION

Figure 1:
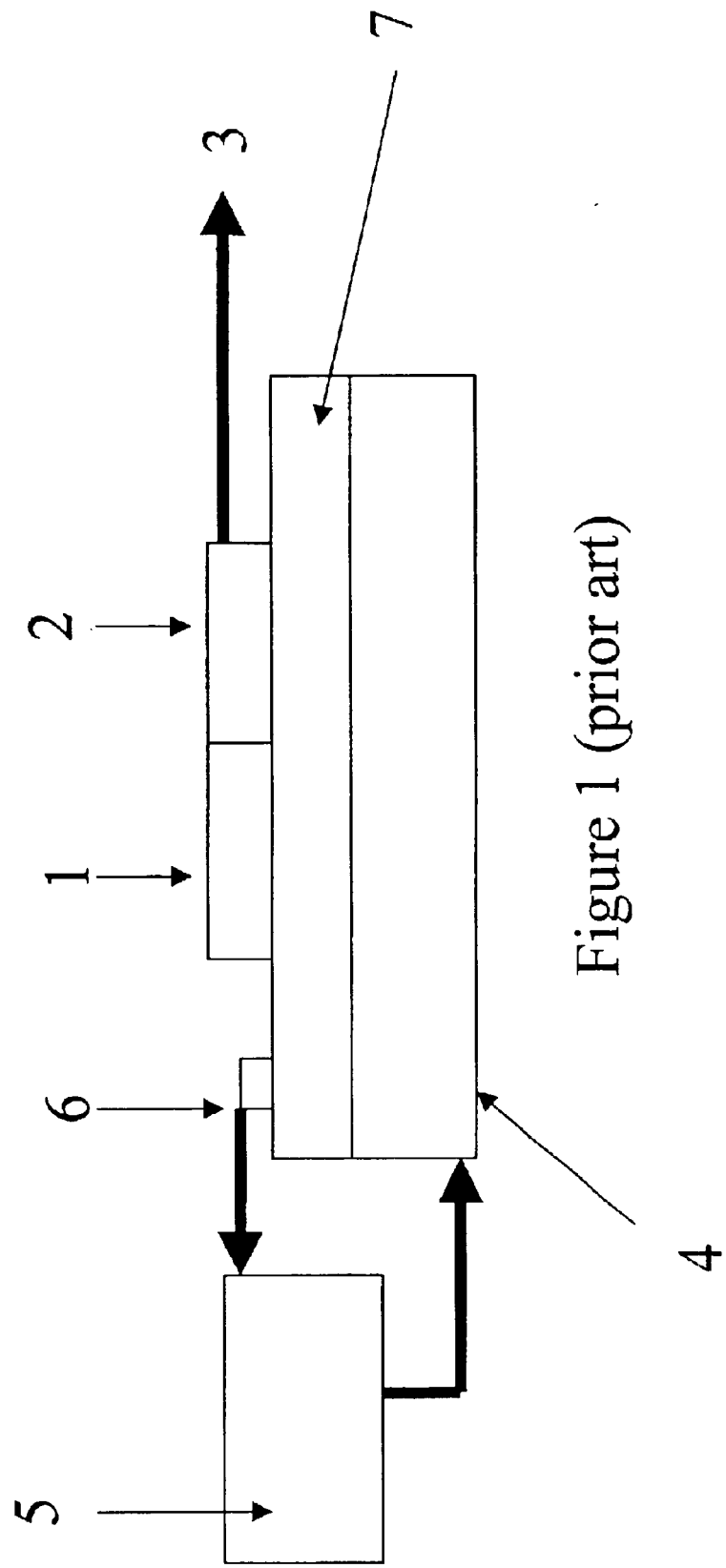
FIG. 1 is a schematic illustration of a prior art modulated light source.

FIG. 1 shows a known device in which a laser 1 and a modulating element 2 are monolithically integrated (i.e. formed on a common substrate 7).

The modulating element 2 has a modulating medium with an absorption edge, the wavelength at which the absorption edge occurs being dependent upon an electric field applied across the modulating medium. The wavelength at which the absorption edge occurs is also dependent upon the temperature of the modulating medium.

A quiescent voltage is applied to the modulating medium such that the wavelength at which the absorption edge occurs is close to the wavelength of the light produced by the laser (typically around 1300 nm or 1550 nm), with the result that a small modulating voltage superimposed on the quiescent voltage will cause a significant modulation in the amount of light that is able to pass through the modulator element.

However, as the wavelength of the light produced by the laser 1, and the absorption edge of the modulating element 2 are highly temperature dependent, the device requires temperature stabilization in order to keep the modulator performance aligned to that of the laser.

In the device shown in FIG. 1, light from the laser 1 is coupled into the modulating element 2 and a modulated signal 3 is generated by application of a modulating voltage across the modulating element 2. The temperature is stabilised using a thermoelectric cooler 4 driven by a control circuit 5, which monitors the temperature of the laser and modulating element using a thermistor or other temperature sensing element 6. The substrate 7 serves to mechanically support the device and ensure that the temperature of the temperature sensing element 6 is similar to that of the laser 1 and modulator 2.

In other known devices the laser and modulating element are co-packaged with coupling performed by a lens. Another option is for the laser and modulating element to be separately packaged each with their own thermal stabilisation means.

Figure 2:
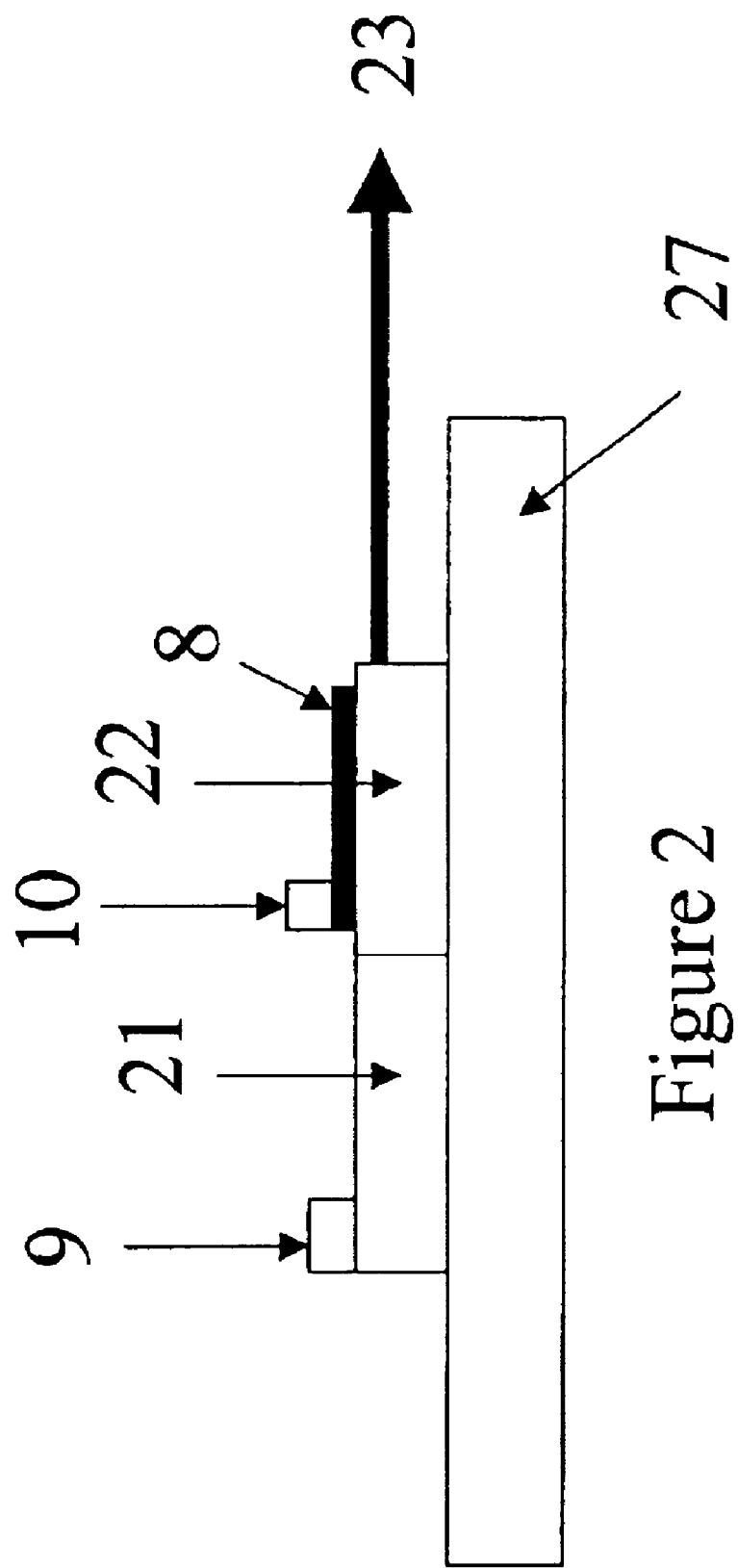
FIG. 2 is a schematic illustration of a modulator assembly according to one embodiment of the present invention.

FIG. 2 illustrates a first embodiment of the present invention in which an electro-absorption modulator 22 having a modulating medium (not shown) is monolithically integrated with a semiconductor laser 21. A heater element 8 is in close proximity to the modulator 22 to control the temperature of the modulator 22 essentially independently of that of the laser 21. As the heating element 8 is close to the modulating medium, very little power is required to maintain the temperature of the modulating medium at a desired temperature above the ambient temperature of the substrate 27.

Temperature sensors 9 and 10 are used to measure the temperatures of the laser and the modulating medium. The sensors may each be a thin film sensor such as a platinum resistance thermometer, or a semiconductor sensor, the semiconductor sensor being for example a p-n junction or a thermistor.

Thus the absorption edge of the modulator 22 is matched to that of the laser 21 by applying heat to the modulator 22 to fix its temperature above the upper temperature of the temperature range of operation of the laser.

In many situations the laser 21 will heat up during use or its temperature will change as a consequence of ambient temperature variations, with the result that the wavelength of the light it produces will change. The temperature of the modulator 22 may be controlled to compensate for the variation in wavelength the light from the laser 21. The temperature may be fixed if the incoming light wavelength is sufficiently stable over the whole operating temperature range.

The modulating medium is formed from a semiconductor material. The semiconductor material is a bulk material, therefore the absorption edge is the band edge of the bulk material, the wavelength of the band edge being electric field dependent according to the Franz-Keldysch effect.

In other embodiments the modulating medium may be formed from a plurality of layers, such as a multiple quantum well structure, and the field dependence of the absorption edge is due to the Quantum Confined Stark Effect. The laser may also be formed from a plurality of different semiconductor layers. The different layers of semiconductor in the modulating medium and/or the laser may be formed from compounds including of In, Ga, As, Al, Sb or P in different proportions, for example GaAs/AlGaAs, InP/Ga(Al)InAsP. Optionally, LiNbO3 polymers, or other materials with a high electro-optic coefficient may also be used.

In the embodiment described an electro-absorption modulator is used. Fabry-Perot resonator modulators and Mach-Zender interferometer modulators may be used in other embodiments of the invention.

It should be noted that the laser and modulator do not need to be integrated as shown in FIG. 2; it is sufficient to be able to measure their relative temperatures in order to maintain alignment of the absorption edge by control of the temperature of the modulating element.

Figure 3:
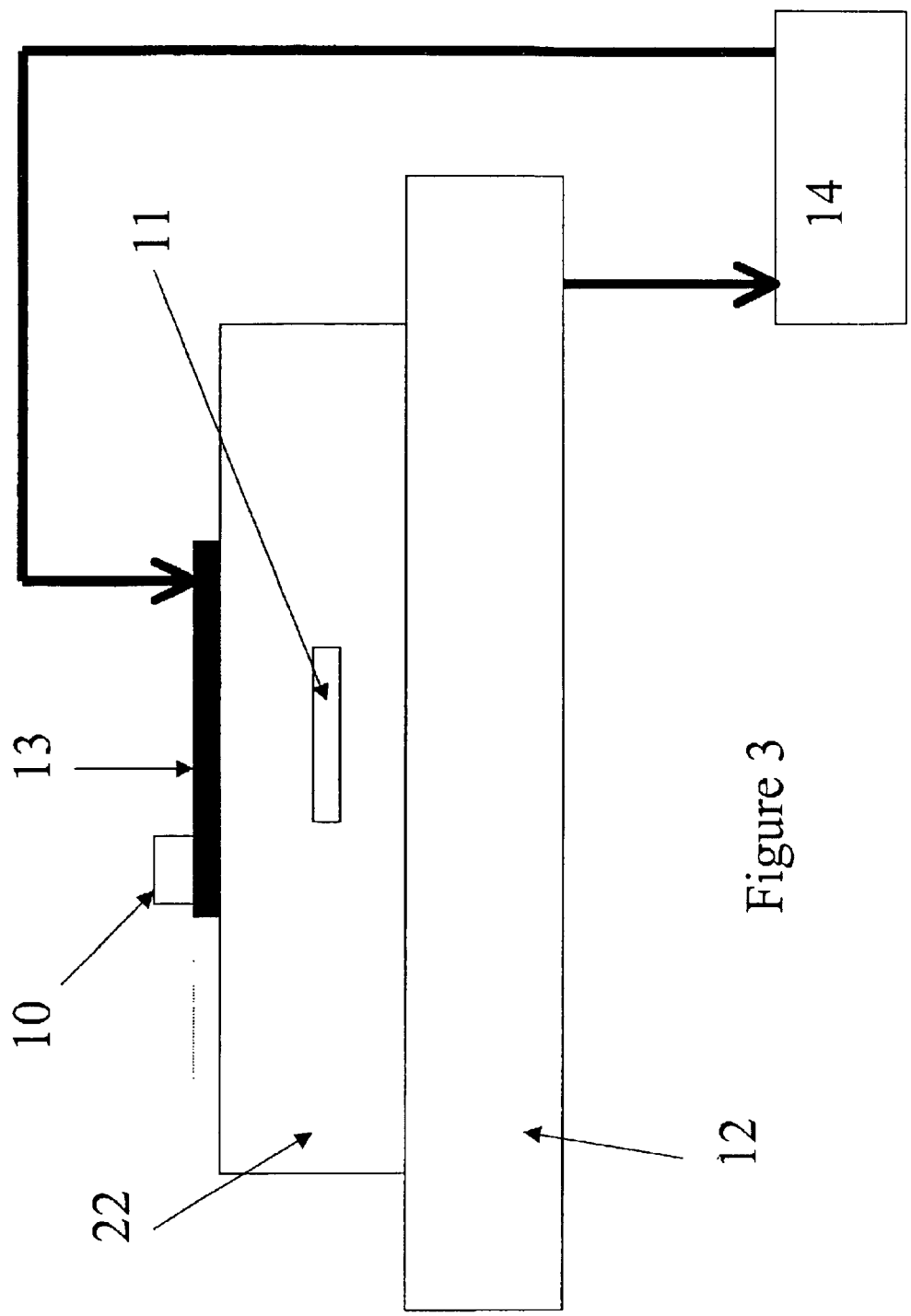
FIGS. 3 and 4 are illustrations of a modulator assembly according to a second embodiment of the present invention.

In FIG. 3 an embodiment of the modulator assembly of this invention is illustrated in which an electrode 13 is used for application of the quiescent voltage together with the modulating voltage across the modulating element 22, the voltage being applied between the electrode 13 and the substrate 12.

In this embodiment the electrode 13 constitutes the heating element and comprises a thin film metallic heater. The heating current is provided by passing a current along the length of the modulator electrode 13.

Figure 4:
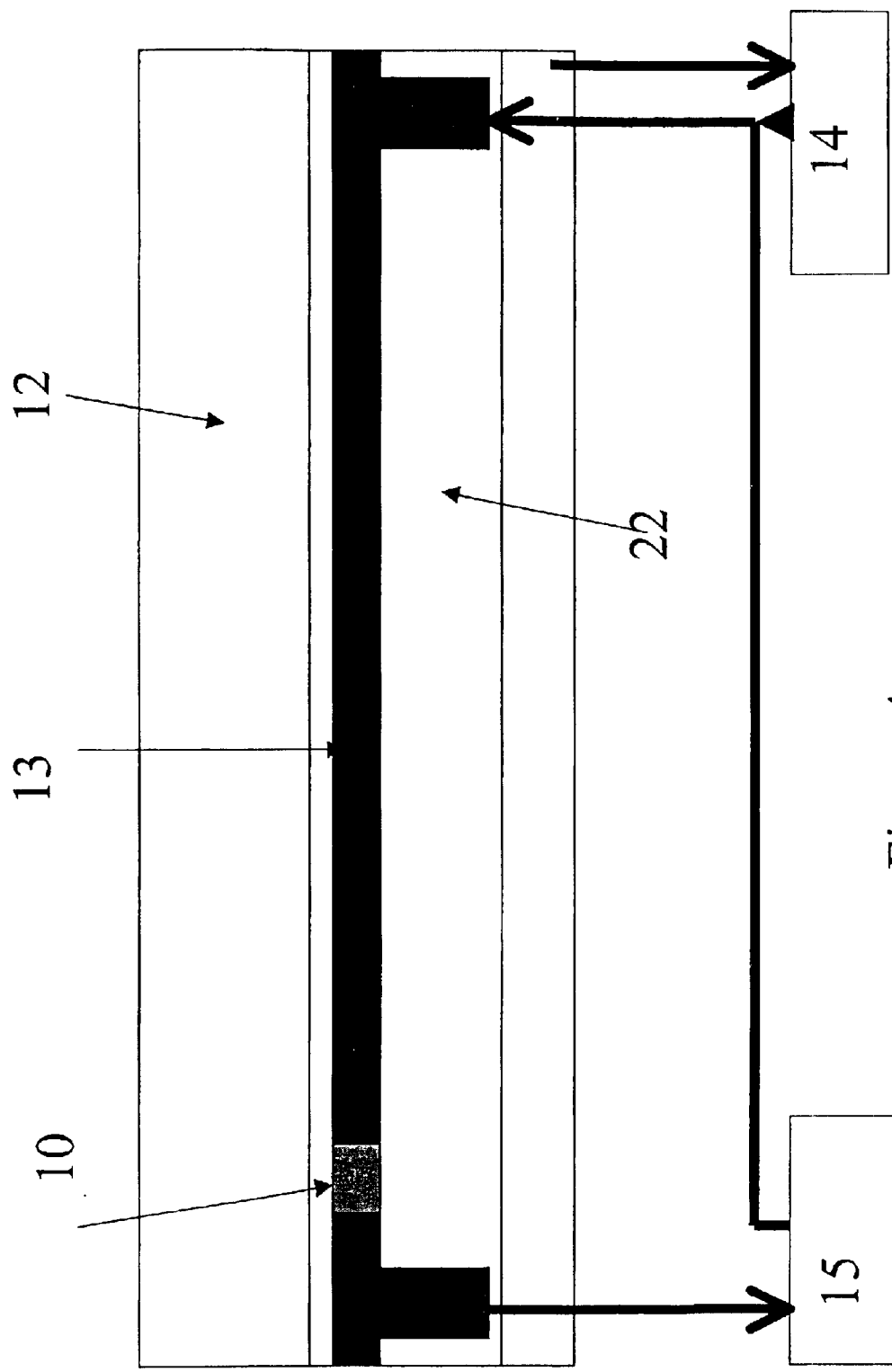

FIG. 4 illustrates a plan view of the modulating element of FIG. 3 along with associated control circuitry. Control circuit 14 is used to provide the modulation signal for the modulating element 22 and control circuit 15 provides the heating current in dependence upon an output from the temperature sensor 10.

Figure 5:
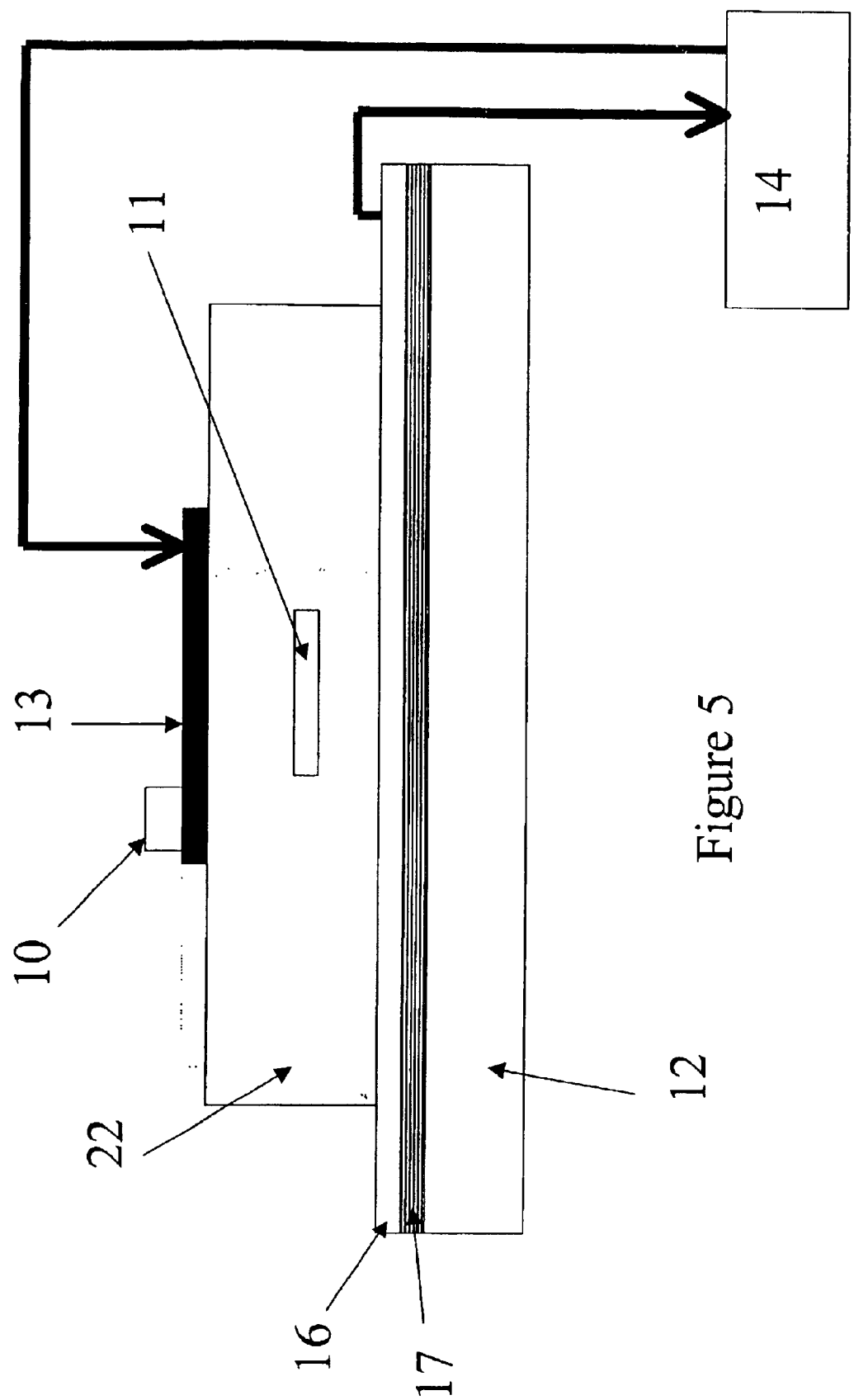
FIG. 5 is an illustration of a modulator assembly according to an embodiment of the invention including an insulating layer.

FIG. 5 illustrates a further embodiment of the modulating element of this invention, the modulating element has a semiconductor insulating layer 17 of low thermal conductivity, below an electrically conducting layer 16 which serves as an electrode for application of the quiescent and modulating voltage across the modulating element.

The insulating layer is designed to decouple the heated section from the substrate, allowing the drive current to be minimised.

Examples of thermally insulating semiconducting materials for devices fabricated on indium phosphide substrates are AlInAs or GaInAlAs as such materials have lower thermal conductivity than indium phosphide. The insulating layer may be fabricated from a dielectric material (i.e. an electrically insulating layer which is neither a metal nor a semiconductor). For example, an oxide of aluminium which may be conveniently formed by the steam oxidation of layers of aluminium containing semiconductors. A further example is a polymer modulator formed on a low thermal conductivity substrate such as glass or ceramic.

Figure 6:
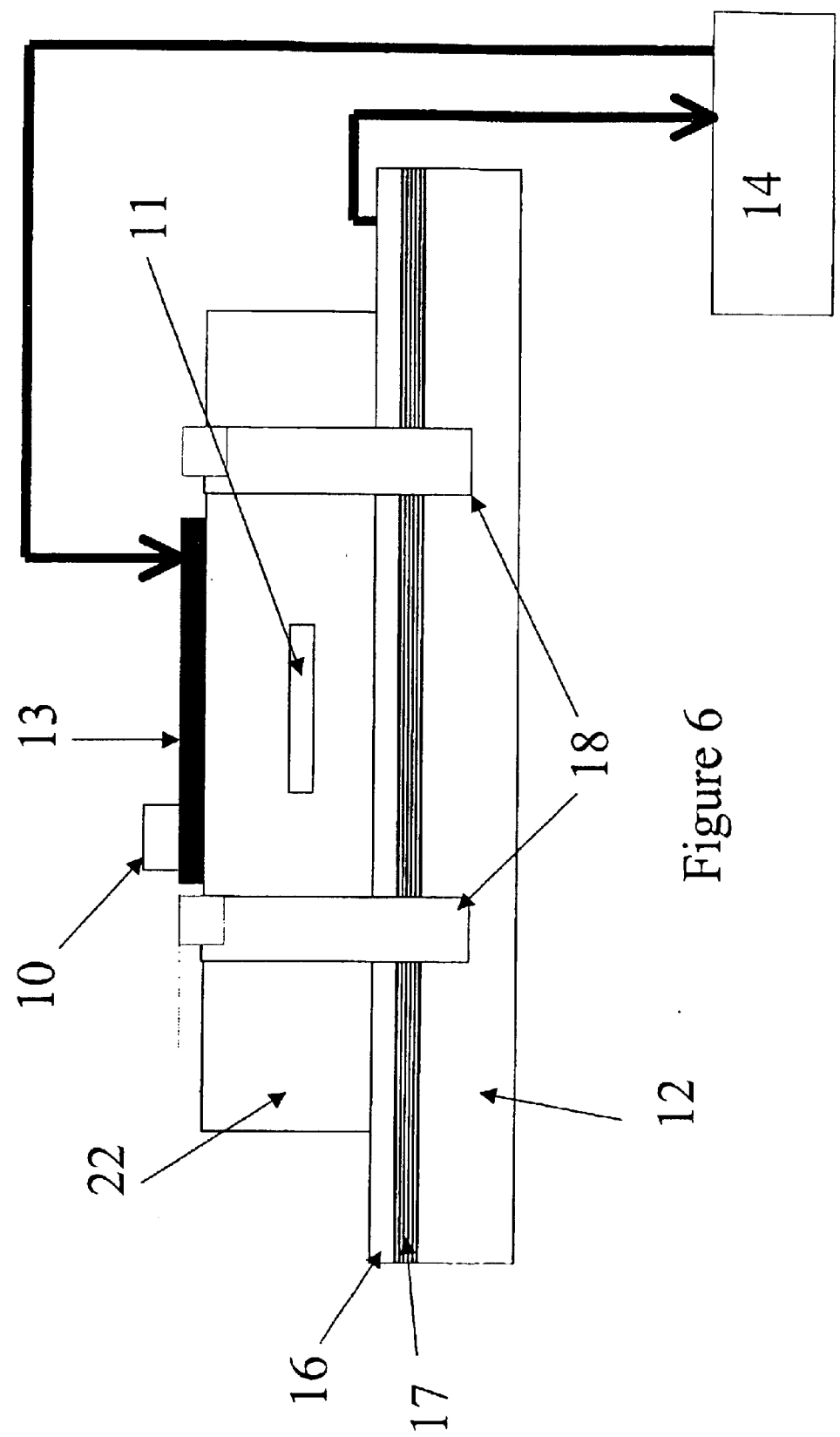
FIGS. 6 and 7 are illustrations of a modulator assembly according to another embodiment of the invention.
Figure 7:
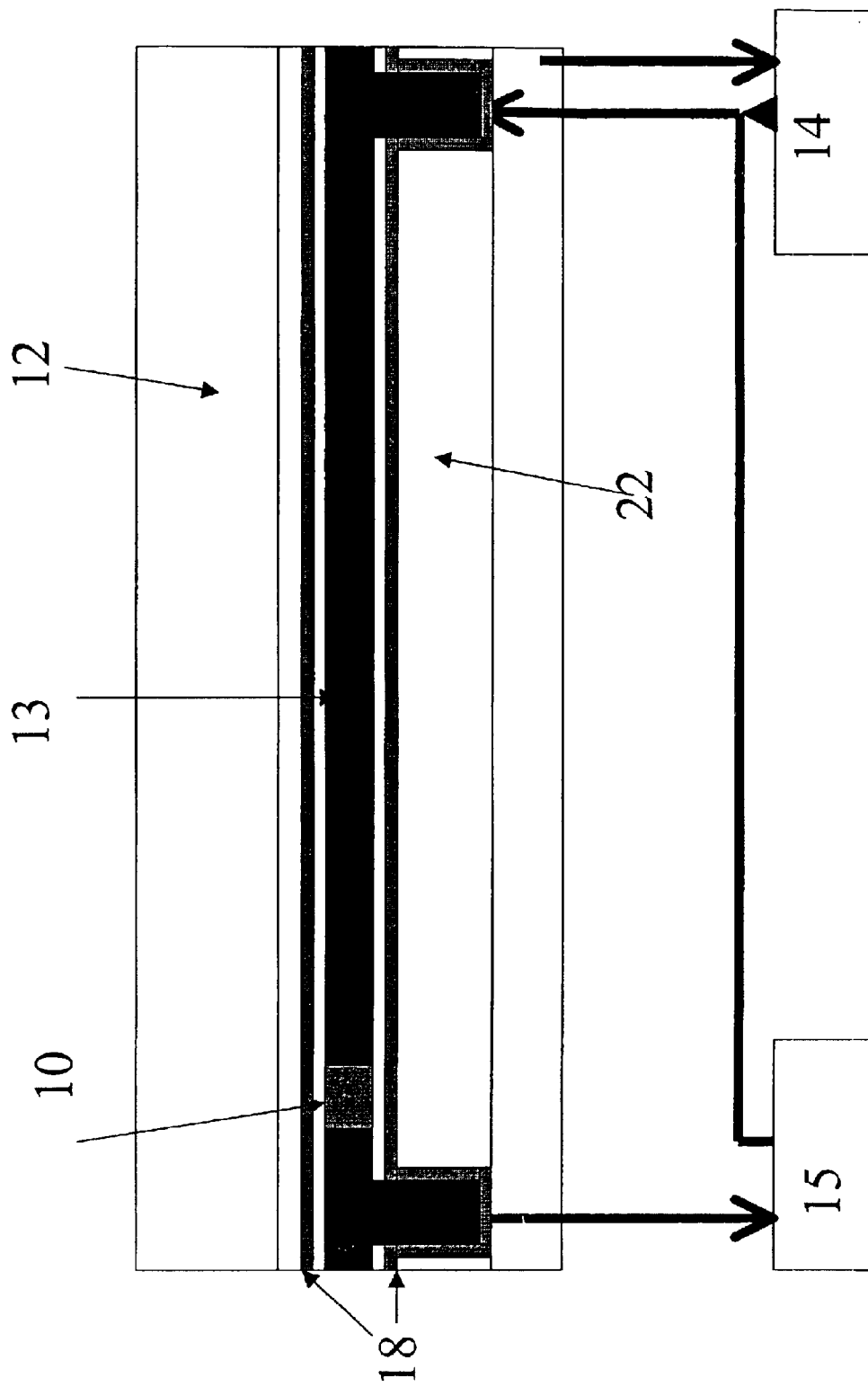

FIG. 6 illustrates modulator assembly according to a further embodiment of the invention in which etched slots 18 are provided close to the modulating medium 11 in order to inhibit loss of heat from the modulating element. Etched slots 18 may be used together with an insulating layer 17, as illustrated, or may be used without such a layer. FIG. 7 is a plan view of the modulating assembly of FIG. 6.

The invention may be implemented by integration of a laser and a modulator assembly as shown in FIG. 2.

In another embodiment of the invention a laser and a modulator may be secured to a common chip carrier and co-packaged.

In other embodiments of the invention a laser is mounted on a chip carrier, and the modulating element is mounted on a second chip carrier allowing the modulator to be run at much higher temperatures than the laser can easily withstand (for example up to 125° C.). The devices may be coupled by an optical fibre. In this case the absorption edge of the modulating element is aligned for optimum performance by monitoring the extinction ratio of the photocurrent which is induced in the modulator. The extinction ratio of the photocurrent is the ratio between the photocurrent induced by an optical signal when the optical signal is passing through the modulator (the on state), and the photocurrent induced by an optical signal when the optical signal is absorbed by the modulator (the off state).

The drive current to the heating element is set at a level which maximises this ratio and hence maximises the ratio between the optical signal which passes through the modulator in the on state, and the optical signal which passes through the modulator in the off state.

What is claimed is:

1. A light modulator assembly comprising
   a modulator element comprising a modulating medium for modulating the intensity of light passing therethrough; and means for applying an electric field across the modulating medium, the modulating medium having an absorption edge at a wavelength dependent upon the temperature of the medium and upon the applied electric field; and
   means for heating the modulating medium such that the wavelength of the absorption edge aligns with the wavelength of the light to be modulated, wherein said means for applying an electric filed comprises an electrode which also constitutes the means for heating the modulating medium.

2. An assembly according to claim 1, in which the means for heating the modulating medium comprises a metallic element in close proximity to the modulator element.

3. An assembly according to claim 1, further comprising a thermally insulating layer of low thermal conductivity, disposed between said modulator element and a substrate.

4. An assembly according to claim 3, in which the insulating layer is a dielectric material.

5. An assembly according to claim 4 where the dielectric material is an oxide of aluminium or a compound of aluminium.

6. An assembly according to claim 1, further comprising slots on each side of the modulating medium.

7. An assembly according to claim 1, in which the extinction ratio of an induced photocurrent in the modulating element is used in a feedback loop to set the drive current of the heating element.

8. An assembly according to claim 1, in which the modulator element is an electro-absorption modulator.

9. An assembly according to claim 1, in which the modulator element is a Mach-Zender modulator.

10. An assembly according to claim 1, in which the modulator is a Fabry-Perot modulator.

11. A modulated light source comprising a laser and a modulator assembly according to claim 1.

12. A modulated light source according to claim 11, wherein the laser and the modulator element are formed on a common substrate as a monolithic device.

13. A modulated light source according to claim 9 in which the laser and the modulator element are secured to a common chip carrier.

14. A light assembly comprising
   a modulator element comprising a modulating medium for modulating the intensity of light passing therethrough; and means for applying an electric filed across the modulating medium, the modulating medium having an absorption range at a wavelength dependent on the temperature of the medium and upon the applied electric field; and
   means for heating the modulating medium such that the wavelength of the absorption edge aligns with the wavelength of the light to be modulated,
   and wherein the extinction ratio of an induced photocurrent in the modulating element is used in a feedback loop to set the drive current of the heating element.

15. A light modulator assembly comprising
   a modulator element comprising a modulating medium for modulating the intensity of light passing therethrough; the modulating medium having an absorption edge at a wavelength dependent upon temperature of the medium and upon electric field applied to the medium, and an electrode positioned and arranged for applying an electric field to the medium and for heating the medium such that the wavelength of the absorption edge aligns with the wavelength of the light to be modulated.

16. A light modulator assembly comprising
   a modulator element comprising a modulating medium for modulating the intensity of light passing therethrough; and an electric field applicator for applying an electric field across the modulating medium, the modulating medium having an absorption edge at a wavelength dependent upon the temperature of the medium and upon the applied electric field;
   a heater for heating the modulating medium such that the wavelength of the absorption edge aligns with the wavelength of the light to be modulated; and
   a feedback loop coupled to be responsive to the extinction ratio of an induced photocurrent in the modulating element for controlling drive current of the heating element.

17. An assembly according to claim 16 wherein the modulator element includes an electrode arrangement, the electrode arrangement being the electric field applicator and the heater.

18. An assembly according to claim 17 wherein the electrode arrangement includes a single electrode forming the electric field applicator and the heater.

* * * * *